United States Patent [19]

Manabe

[11] Patent Number: 4,797,726
[45] Date of Patent: Jan. 10, 1989

[54] LEAD FRAME INCLUDING DEFORMABLE PLATES

[75] Inventor: Masamichi Manabe, Yamanachi, Japan

[73] Assignee: Pioneer Electronic Corporation, Tokyo, Japan

[21] Appl. No.: 347,611

[22] Filed: Feb. 10, 1982

[30] Foreign Application Priority Data

Feb. 10, 1981 [JP] Japan .................. 56-18676

[51] Int. Cl.$^4$ .................. H01L 23/48; H01L 23/12
[52] U.S. Cl. .................................................. 357/70
[58] Field of Search ..................... 357/70, 65, 66; 174/52 FP

[56] References Cited

U.S. PATENT DOCUMENTS

| | | | |
|---|---|---|---|
| 3,708,730 | 1/1973 | Schierz et al. | 357/70 |
| 4,048,438 | 9/1977 | Zimmerman | 357/70 |
| 4,109,269 | 8/1978 | Hatch | 357/68 |
| 4,258,381 | 3/1981 | Inaba | 357/70 |
| 4,326,215 | 4/1982 | Suzuki et al. | 357/68 |

Primary Examiner—Andrew J. James
Assistant Examiner—S. V. Clark
Attorney, Agent, or Firm—Sughrue, Mion, Zinn, Macpeak & Seas

[57] ABSTRACT

A lead frame for a semiconductor chip has a plurality of supporting plates connecting to each other by a plurality of readily deformable plates so that a predetermined gap exists between adjacent supporting plates. When the semiconductor chip and the supporting plates are heated when fixing the semiconductor chip to the supporting plates by melting a conductive adhesive, less stress is induced in the semiconductor chip due to uneven thermal expansion between the chip and the supporting plates since a reduced area of the chip is fixed to the supporting plates.

9 Claims, 2 Drawing Sheets

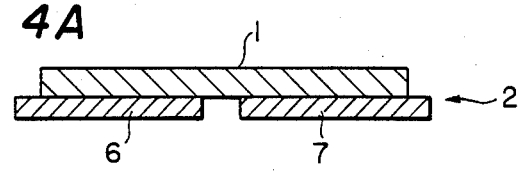
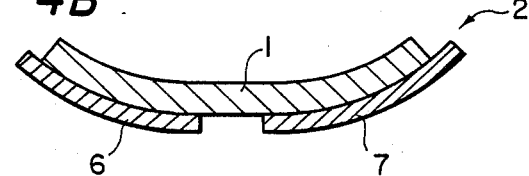
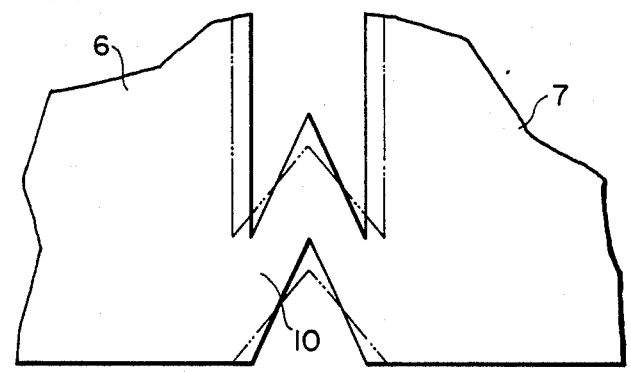
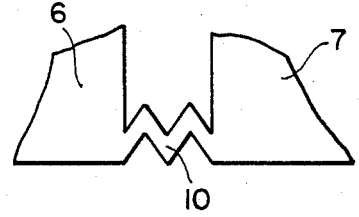
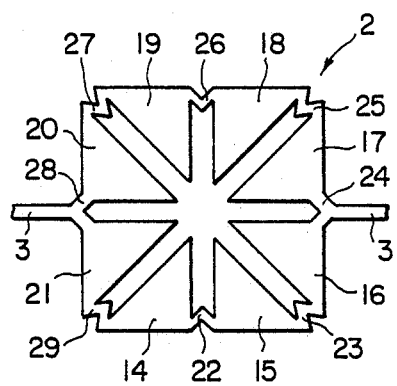

LEAD FRAME INCLUDING DEFORMABLE PLATES

BACKGROUND OF THE INVENTION

1. Field of the Invention

This invention relates to a lead frame which provides lead wires for an electronic part such as an intergrated circuit (IC) and which serves as a frame in the process of manufacturing the electronic part.

2. Description of the Prior Art

In assembling semiconductor devices such as transistors and integrated circuits, the semiconductor devices are often assembled successively on a lead frame having a metal ribbon with a plurality of metal wires formed by blanking. The lead frame includes portions on which semiconductor chips are fixedly set, portions used for wire bonding, and portions which are used as external lead wires when the semiconductor devices have been assembled.

FIG. 1 is a plane view of a conventional lead frame showing only a part of the lead frame which supports one semiconductor device. The lead frame is for a resin mold type semiconductor device. The lead frame has a square chip fixing plate 2 on which a semiconductor chip 1 is fixedly placed. A rectangular connecting frame plate 3 has one side which extends perpendicularly from the centers of two opposed sides of the chip fixing plate 2. A plurality of external connection electrode plates 4 are also provided and each electrode plate 4 has a lead wire connecting portion 4a which is used for wire bonding and a lead wire portion 4b. The lead wire connecting portions 4a confront the chip fixing plate 2 and the lead wire portion 4b is connected to the connecting frame plate 3.

When a semiconductor device is fixed to the lead frame described above, the semiconductor chip 1 is fixedly set on the chip fixing plate 2 and bonding pads 1a on the semiconductor chip 1 are connected to the lead wire connecting portions 4a with thin conductors 5 by bonding. Thereafter, the entire region indicated by the two-dot chain line in FIG. 1 identified by reference number 19 is molded with resin and then the lead frame is cut along the two-dot chain lines in FIG. 1 identified by reference number 20 to remove the part of the connecting frame plate 3 which becomes unnecessary after the semiconductor device has been molded in place. This forms a resin mold type semiconductor device.

When the semiconductor chip 1 is fixiedly set on the chip fixing plate 2 of the lead frame, both the chip 1 and plate 2 are flat as shown in FIG. 2(A). However, since the thermal coefficient of expansion of the chip 1 is different from that of the plate 2, when the temperature is raised in the resin molding operation, the semiconductor chip 1 and the chip fixing plate 2 become deformed as shown in FIG. 2(B). As a result of this deformation, stresses are set up in the semiconductor chip 1 and the chip fixing plate 2. If a large semiconductor chip is to be fixed to the lead plate, a rather large area is used for fixing the semiconductor chip 1 to the chip fixing plate 2 which produces rather large temperature induced stresses. As the size of the semiconductor chip increases, so do the stresses. Accordingly, when the semiconductor chip 1 is $1 \times 1$ cm$^2$, it is sometimes cracked because the termperature induced stresses exceed a value allowable for the chip 1.

SUMMARY OF THE INVENTION

Accordingly, an object of this invention is to provide a lead frame in which stress caused by temperature increases is made small so that even if a large chip is fixed to the lead frame the large chip will not crack.

The lead frame according to the present invention has a chip fixing plate which comprises a plurality of readily deformable plates and a plurality of supporting plates. The plurality of supporting plates are coupled to one another by the readily deformable plates which results in less stress being induced in the chip upon heating.

BRIEF DESCRIPTION OF THE DRAWINGS

FIGS. 4(A) and 4(B) are sectional views showing a part of FIG. 3.

FIG. 4(C) is an enlarged view of a part of the lead frame shown in FIG. 3.

FIGS. 5 and 6 are plane views showing further embodiments of the lead frame according to the invention.

DESCRIPTION OF THE PREFERRED EMBODIMENTS

Figure 3:
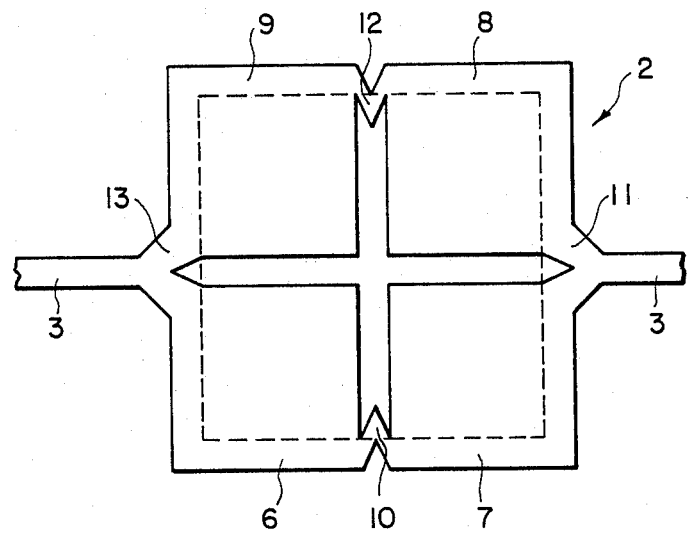
FIG. 3 is a plane view showing a part of a lead frame according to the present invention.

FIG. 3 is a diagram showing one embodiment of a lead frame according to the present invention. A chip fixing plate 2 is shown in FIG. 3 as well as a part of a connecting frame plate 3. The remaining part of the connecting frame plate 3 and electrode plates 4 are not shown in FIG. 3 because they are similar in configuration to those shown in FIG. 1. The chip fixing plate 2 comprises four supporting plates 6, 7, 8 and 9 which have a substantially rectangular or square shape and four readily deformable plates 10, 11, 12 and 13 which are each belt-shaped. The supporting plate 6 is adjacent to the supporting plate 7 with a predetermined gap being provided therebetween, the supporting plate 7 is adjacent to the supporting plate 8 with the predetermined gap being provided therebetween also, and so on. Each readily deformable plate is bent at the central portions thereof and two adjacent supporting plates are connected to each other through one readily deformable plate. The supporting plates and the readily deformable plates are integral with each other to form the chip fixing plate 2. The chip fixing plate 2 preferably is provided by blanking.

Figure 1:
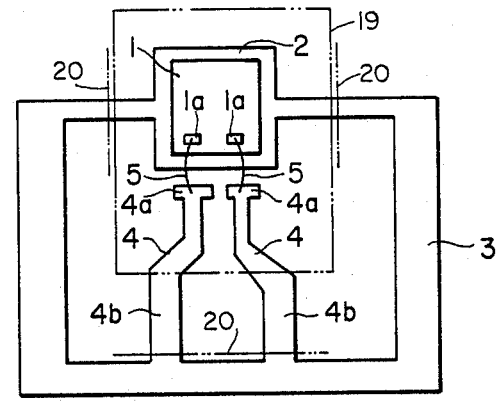
FIG. 1 is a plane view showing a conventional lead frame.
Figure 2A:
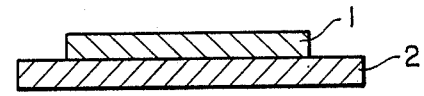
FIGS. 2(A) and 2(B) are sectional views showing a part of FIG. 1.
Figure 2B:

With the lead frame described above, a semiconductor device can be secured to the lead frame in the same manner as it is when the semiconductor device is secured to the conventional lead frame shown in FIG. 1. That is, the semiconductor chip 1 is fixedly set at a position indicated by the dotted line in FIG. 3 by a method in which gold-silicon entectic, electrically conductive adhesive or other suitable material is used. Prior to fixedly setting the semiconductor chip 1, the chip 1 and the chip fixing plate 2 are flat as shown in FIG. 4(A). However, when the lead frame according to the present invention, and in particular the supporting plates 6 and 7 thereof along with the semiconductor chip 1, are deformed by the temperature rise which is caused by the resin molding, stresses are set up in the supporting plates 6 and 7 and the semiconductor chip 1 causing the deformation showin in FIG. 4(B). Since the area of the semiconductor chip which is used to fix it to the supporting plates 6 and 7 is smaller than that of the semiconductor chip 1 which is used to fix it to the chip fixing plate 2 in the conventional lead frame, the stresses set up in the semiconductor chip 1 in the vicinity of the supporting plates 6 and 7 are smaller than those which are created when the conventional lead frame is used. The stresses set up in the semiconductor chip 1 in the vicinity of the remaining supporting plates 8 and 9 are similar to the stresses set up in the vicinity of the supporting plates 6 and 7.

As the gap between the supporting plates 6 and 7 increases, the bend angle of the bent portion of the readily deformable plate 10 is changed from the configuration indicated by the solid line in FIG. 4(C) to that indicated by the dotted line in this figure. This deformation occurs in the other readily deformable plates 11, 12 and 13 as the gaps between the supporting plates 7 and 8, 8 and 9, and 6 and 9 are increased respectively due to heating. The deformation is caused even if external forces which are exerted on the gaps between the supporting plates 6 and 7, 7 and 8, 8 and 9, and 9 and 6 to increase or decrease the gaps are small. The area of the semiconductor chip 1 which is fixed to each of the readily deformable plates 10 through 13 is very small and the semiconductor chip 1 is weakly coupled mechanically to each of the readily deformable plates 10 through 13. Therefore, in the vicinities of the gaps between the supporting plates 6 and 7, 7 and 8, 8 and 9 and 9 and 6, the semiconductor chip 1 expands substantially freely with its intrinsic thermal expansion coefficient as the temperature rises. Thus, the external force exerted on the chip 1 is very small and the stress set up in the chip 1 is also very small.

Accordingly, with the above-described example of the lead frame according to the invention, the stress set up in the semiconductor chip 1 due to the temperature rise is small and cracking or the like of the chip 1 is prevented.

FIG. 5 is a plane view showing a part of another embodiment of the lead frame according to the present invention. In this embodiment, a readily deformable plate 10 has a zigzag shape, that is, it is bent at three points. Readily deformable plates 11, 12 and 13 (not shown) are similar in configuration to the readily deformable plate 10. The other plates are similar to those in FIG. 3. This embodiment functions like the embodiment of FIG. 3 when heated.

FIG. 6 is a plane view showing a part of a third embodiment of the lead frame according to the present invention. The lead frame has a chip fixing plate 2 comprising eight substantially triangular supporting plates 14 through 21 and readily deformable plates 22 through 29 which are substantially similar in configuration to plates 10 through 13 in FIG. 3. The supporting plates 14 through 21 are adjacent to one another with a predetermined gap being provided therebetween and the adjacent supporting plates are coupled to one another through the readily deformable plates 22 through 29, respectively. The other plates of the lead frame are similar to those in FIG. 1. In this third embodiment the area of the semiconductor chip 1 which is used to fix the latter 1 to the supporting plates 14 through 21 is smaller than that of the semiconductor chip 1 which is used to fix it to the supporting plates 6 through 9 in the first embodiment shown in FIG. 3. Therefore, the stress set up in the chip 1 is further reduced.

As is apparent from the above description, the lead frame of the invention can reduce the stress which is set up in a semiconductor chip fixed thereto when the temperature rises. Therefore, a large area chip can be fixed to the lead frame.

I claim:

1. A lead frame of the type having a chip fixing plate for supporting an electronic part in a device wherein said electronic part is fixed to said chip fixing plate and the electronic part and chip fixing plate are subsequently subjected to heat, e.g., in a resin encapsulation process, said chip fixing plate comprising:
   a plurality of supporting plate portions to which said electronic part is to be fixed; and
   a plurality of readily deformable plate portions coupling said supporting plate portions to one another and for deforming to allow said supporting plate portions to move with respect to one another to compensate for differences in thermal expansion of said electronic part and chip fixing plate when said electronic part and chip fixing plate are subjected to heat, said readily deformable plate portions each comprising belt-shaped plate portions each having first and seconds ends respectively coupled to adjacent supporting plate portions, each said belt-shaped plate portion having a bent portion intermediate said first and second ends and bent at a predetermined angle, said belt-shaped portions being readily deformable to vary said angle to allow adjacent supporting plates to move with respect to one another.

2. A lead frame of the type having a chip fixing plate for supporting an electronic part in a device wherein said electronic part has first and second surfaces and said first surface is fixed to said chip fixing plate and the electronic part and chip fixing plate are subsequently subjected to heat, e.g., in a resin encapsulation process, said lead frame including lead (e.g., 4a, 4b) wires for connection to bonding portions (e.g. 1a) on said second surface, said chip fixing plate comprising:
   a plurality of supporting plate portions to which said first surface of said electronic part is to be fixed; and
   a plurality of readily deformable plate portions for coupling said supporting plate portions to one another and for deforming to allow said supporting plate portions to move with respect to one another to compensate for differences in thermal expansion of said electronic part and chip fixing plate when said electronic part and chip fixing plate are subjected to heat.

3. A lead frame as claimed in claim 1 or 2, wherein said readily deformable plate portions are at least partially underneath said electronic part and in contact with said first surface.

4. The lead frame claimed in claim 1 wherein a predetermined gap is formed between adjacent supporting plates which are connecting by said readily deformable plates.

5. The lead frame claimed in claim 4 wherein each of said readily deformable plates has a zigzag belt shape.

6. The lead frame claimed in claim 1 wherein each of said supporting plates has a rectangular shape.

7. The lead frame claimed in claim 1 wherein each of said supporting plates has a square shape.

8. The lead frame claimed in claim 1 wherein each of said supporting plates has a triangular shape.

9. The lead frame claimed in any one of claims 1, 4, 5, 6 and 8 wherein said chip fixing plate is formed by blanking.

* * * * *